US011569831B1

(12) United States Patent
Grimaldi et al.

(10) Patent No.: US 11,569,831 B1
(45) Date of Patent: Jan. 31, 2023

(54) TIME-TO-DIGITAL CONVERTER CALIBRATION

(71) Applicant: Infineon Technologies AG, Neubiberg (DE)

(72) Inventors: Luigi Grimaldi, Villach (AT); Dmytro Cherniak, Villach (AT); Qianqian Ha, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/656,176

(22) Filed: Mar. 23, 2022

(51) Int. Cl.

| | |
|---|---|
| ***H03M 1/10*** | (2006.01) |
| ***H03L 7/085*** | (2006.01) |
| ***H03L 7/18*** | (2006.01) |
| ***G04F 10/00*** | (2006.01) |
| ***H03L 7/099*** | (2006.01) |
| *H03M 3/00* | (2006.01) |

(52) U.S. Cl.
CPC ........ *H03M 1/1014* (2013.01); *G04F 10/005* (2013.01); *H03L 7/085* (2013.01); *H03L 7/099* (2013.01); *H03L 7/18* (2013.01); *H03M 3/378* (2013.01)

(58) Field of Classification Search
CPC ... H03M 1/1014; H03M 3/378; G04F 10/005; H03L 7/085; H03L 7/099; H03L 7/18
See application file for complete search history.

(56) References Cited

U.S. PATENT DOCUMENTS 8,497,716 B2 * 7/2013 Zhang .................. H03L 7/1976 327/147
9,455,667 B2 * 9/2016 Vlachogiannakis .. H03M 1/002
9,791,834 B1 * 10/2017 Nassar ................. G04F 10/005
(Continued)

FOREIGN PATENT DOCUMENTS

DE 112013007280 T5 * 4/2016 .......... G04F 10/005
DE 102014017440 B4 * 11/2018 .......... H03F 1/3241

OTHER PUBLICATIONS

G. Marzin et al., "A Background Calibration Technique to Control Bandwidth in Digital PLLs," 2014 IEEE International Solid-State Circuits Conference, Milan, Italy, 2014, 3 pages.
(Continued)

*Primary Examiner* — Adam D Houston
(74) *Attorney, Agent, or Firm* — Harrity & Harrity, LLP

(57) ABSTRACT

A digital phase-locked loop (DPLL) may include a time-to-digital converter (TDC) to provide a phase error signal, a frequency-divider to perform frequency division on an output signal to generate a frequency-divided output signal, a delta-sigma-modulator (DSM) to provide a test signal that represents a quantization error of the DSM, and a digital-to-time converter (DTC) to at least partially remove the quantization error from the frequency-divided output signal based on the test signal to generate the feedback signal. The DPLL may include a circuit to cause the DTC to provide a percentage of the quantization error such that the percentage of the quantization error is in the phase error signal, and a TDC calibration component to calibrate the TDC by apply- (Continued)

200

REF 102
r
TDC 104
e
DLF 106
DCO 108
out
fb
DIV 110
TDC Calibration 114
t
DSM 112 ing a gain adjustment factor to the TDC. The gain adjustment factor may be based on the test signal and the phase error signal including the percentage of the quantization error.

20 Claims, 5 Drawing Sheets

(56) References Cited

U.S. PATENT DOCUMENTS 10,158,366 B2 * 12/2018 Galton .................... H03L 7/193
10,862,489 B2 * 12/2020 van den Heuvel ... H03L 7/0991
10,895,850 B1 * 1/2021 Elkholy ................ G04F 10/005
10,911,054 B2 * 2/2021 Yeo ......................... H03L 7/093
10,965,297 B1 * 3/2021 Wu ....................... H03L 7/0805
11,031,945 B1 * 6/2021 Maltabas .................. H03L 7/18
11,038,511 B2 * 6/2021 Weeks .................. H03L 7/0805
11,075,642 B2 * 7/2021 Shi .......................... H03L 7/099
11,239,853 B1 * 2/2022 Dai ....................... H03M 1/804
11,283,459 B1 * 3/2022 Monk ..................... H03L 7/085
11,418,199 B1 * 8/2022 Cherniak ................ H03L 7/087
11,418,205 B1 * 8/2022 Schwarz ............... H03L 7/0992
2013/0002317 A1 1/2013 Frantzeskakis
2013/0162355 A1 * 6/2013 Mendel .................. H03L 7/095
331/16
2017/0205772 A1 * 7/2017 Burg ..................... G04F 10/005
2020/0186156 A1 6/2020 Elkholy
2020/0195263 A1 * 6/2020 Khoury ................. G06F 1/0321
2022/0014208 A1 * 1/2022 Choi ..................... H03M 3/322
2022/0255553 A1 * 8/2022 Zhao ....................... H03M 1/50

OTHER PUBLICATIONS

R. Enomoto et al., "A 16-bit 2.0-ps Resolution Two-Step TDC in 0.18-μm CMOS Utilizing Pulse-Shrinking Fine Stage With Built-In Coarse Gain Calibration," IEEE Transactions on Very Large Scale Integration (VLSI) Systems, vol. 27, No. 1, Jan. 2019, 9 pages.
H. Liu et al., "A Sub-mW Fractional-N ADPLL With FOM of -246 dB for IoT Applications," IEEE Journal of Solid-State Circuits, vol. 53, No. 12, Dec. 2018, 13 pages.

* cited by examiner

200

$G^* = T_{DCO} * K_{TDC}^{ideal}$ $g_{TDC} = \frac{K_{TDC}^{ideal}}{K_{TDC}}$

TIME-TO-DIGITAL CONVERTER CALIBRATION

BACKGROUND

A phase-locked loop (PLL) is a device that generates a clock and synchronizes the clock with a reference signal. One application of a PLL is frequency synthesis. In a frequency synthesis application, a PLL can be used to generate a clock based on a reference clock (e.g., a reference signal provided by a reference oscillator). Notably, a frequency of the clock generated by the PLL can be a multiple of a frequency the original clock. A digital PLL (DPLL) is a type of PLL that can be used to synchronize digital signals. Components of a DPLL include a phase detector (e.g., a time-to-digital convertor (TDC)), a digital loop filter (DLF), an oscillator, and a divider. Notably, in the case of an all-digital PLL (ADPLL), the oscillator is a digitally-controlled oscillator (DCO) (rather than a voltage-controlled oscillator (VCO) as used in a conventional DPLL). In operation of a DPLL, the phase detector senses a phase difference between a reference signal and a feedback signal, with the feedback signal being generated by dividing an output signal of DCO. The phase detector converts the phase difference to a phase error signal in the digital domain, and the phase error signal is filtered by the DLF and is then used to control the DCO.

SUMMARY

In some implementations, a DPLL includes a time-to-digital converter (TDC) configured to provide a phase error signal that indicates a phase difference between a reference signal and a feedback signal; a frequency divider configured to perform frequency division on an output signal of the DPLL to generate a frequency-divided output signal, and a delta-sigma modulator (DSM) configured to provide a test signal that represents a quantization error of the DSM; a digital-to-time converter (DTC) configured to at least partially remove the quantization error of the DSM from the frequency-divided output signal based on the test signal to generate the feedback signal; a circuit component to, during operation in a TDC calibration mode, cause the DTC to provide a predetermined percentage of the quantization error such that the predetermined percentage of the quantization error is included in the phase error signal; and a TDC calibration component configured to, during operation in the TDC calibration mode, calibrate the TDC by applying a gain adjustment factor to the TDC, wherein the gain adjustment factor is based on the test signal and the phase error signal including the predetermined percentage of the quantization error.

In some implementations, a DPLL includes a TDC configured to provide a phase error signal that indicates a phase difference between a reference signal and a feedback signal; a frequency divider configured to perform frequency division on an output signal of the DPLL to generate the feedback signal; a DSM configured to provide a test signal associated with calibrating the TDC, wherein the test signal represents a quantization error of the DSM; and a TDC calibration component configured to calibrate the TDC while the DPLL is operating in a phase-locked state by applying a gain adjustment factor to the TDC, wherein the gain adjustment factor is based on the phase error signal and the test signal.

In some implementations, a method, comprising; causing, during operation in a TDC calibration mode, a predetermined percentage of a quantization error of a DSM of a DPLL to be included in a phase error signal provided by a TDC of the DPLL; calibrating, during operation in the TDC calibration mode, the TDC by applying a gain adjustment factor to the TDC, wherein the gain adjustment factor is based on a test signal representing the quantization error of the DSM and the phase error signal including the predetermined percentage of the quantization error; determining that a gain of the TDC matches an ideal gain of the TDC; freezing the gain of the TDC and entering a normal operation mode based on determining that the gain of the TDC matches the ideal gain of the TDC; and preventing, during operation in the normal operation mode, the quantization error from being included in the phase error signal provided by the TDC.

DETAILED DESCRIPTION

Figure 1A:
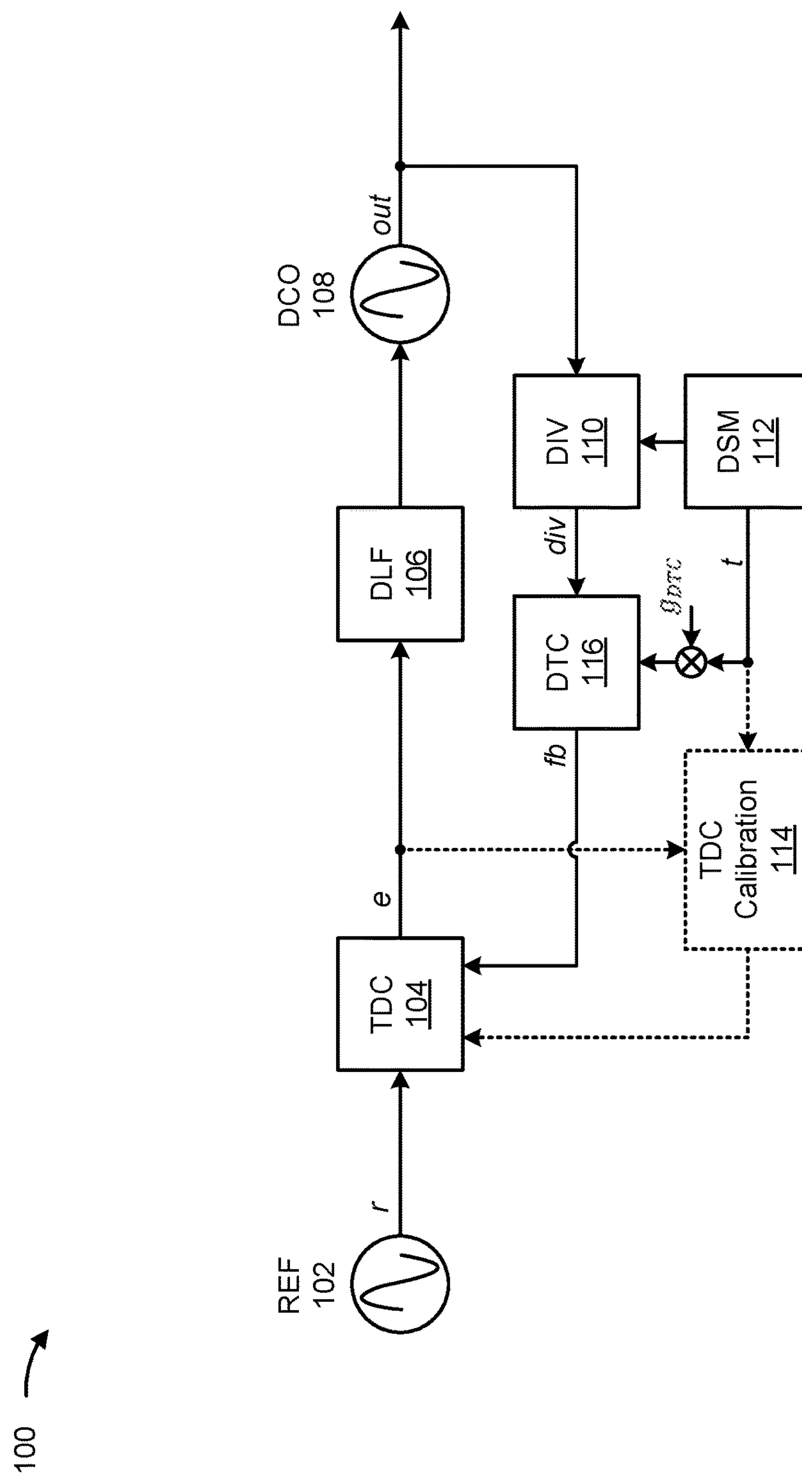
FIGS. 1A and 1B are diagrams associated with an example implementation of a DPLL capable of providing TDC calibration, as described herein.

The following detailed description of example implementations refers to the accompanying drawings. The same reference numbers in different drawings may identify the same or similar elements.

A DPLL (e.g., an ADPLL) may need to satisfy a stringent requirement in terms of spot phase noise (also referred to as emission mask) in a given application. For example, a DPLL used in a communication application or in a radar application may need to satisfy a stringent requirement in terms of spot phase noise. In practice, spot phase noise of a DPLL can be managed through control of a bandwidth of the DPLL. Therefore, providing bandwidth control is one technique that can facilitate satisfaction of a spot phase noise requirement. Notably, control of a bandwidth of a DPLL may also be important in another application of a DPLL, such as for a DPLL used in a Bluetooth low energy (BLE) application, particularly when a single point modulation scheme based on pre-emphasis is used.

Process-voltage-temperature (PVT) variations impact gain of some components of a DPLL, namely a TDC and a DCO. Therefore, PVT variations can result in instability or variation of the DPLL bandwidth, meaning that PVT variations could result in a failure to satisfy a spot phase noise requirement (e.g., due to unfiltered noise or instability peaking) in a given application. One technique that can be used to reduce or eliminate the impact of PVT variations on the DPLL is to perform calibration of a TDC of the DPLL.

One approach for TDC calibration utilizes a particular TDC topology—a time amplifier (TA)-based TDC. However, a TA-based TDC requires additional components to correct for both gain and offset. Thus, this approach results in an increase of area, cost, and complexity of an analog part of the DPLL. Another approach for calibration can provide for control of the bandwidth of a DPLL but does not allow individual control of the gain of the TDC. More particularly, this approach uses an overall normalization factor in association with calibration, meaning that information on the gain of the TDC is lumped with information on other components of the DPLL and, therefore, gain of the TDC cannot be directly controlled. Another approach for TDC calibration is based on delay stages. Here, what is typically performed as a calibration step is to close the delay stages in a ring configuration and calibrate the delay stages by controlling the frequency. However, while this approach can provide sufficient calibration of the delay stages, this approach is applicable to a particular TDC topology and cannot be applied to some sophisticated TDC architectures, such as an analog-to-digital convertor (ADC)-based architecture.

Some implementations described herein provide techniques and apparatuses for TDC calibration in a DPLL. In some implementations, the techniques and apparatuses described herein serve to reduce or eliminate an impact of PVT variation on bandwidth control of a DPLL through gain control of a TDC. That is, the techniques and apparatuses described herein enable calibration and control of a gain of a TDC to account for PVT variation so that bandwidth of the DPLL can be adequately controlled, thereby facilitating satisfaction of a spot phase noise requirement of the DPLL. In some implementations, as described herein, a DPLL may include a TDC calibration component configured to calibrate the TDC (e.g., while the DPLL is operating in a phase-locked state) by applying a gain adjustment factor to the TDC. In some implementations, the gain adjustment factor is based on a phase error signal and a test signal that represents a quantization error of a DSM of the DPLL. Additional details are provided below.

Notably, the techniques and apparatuses described herein provide TDC calibration without a need for additional components in the analog part, meaning that area, cost, and complexity of the analog part of the DPLL are not increased. Further, the techniques and apparatuses described herein provide for direct and individual control of the gain of the TDC (e.g., rather than control through an overall normalization factor). Additionally, the techniques and apparatuses described herein provide TDC calibration is not topology specific, meaning that the techniques and apparatuses described herein can be utilized in a wide variety of TDC topologies.

Figure 1B:
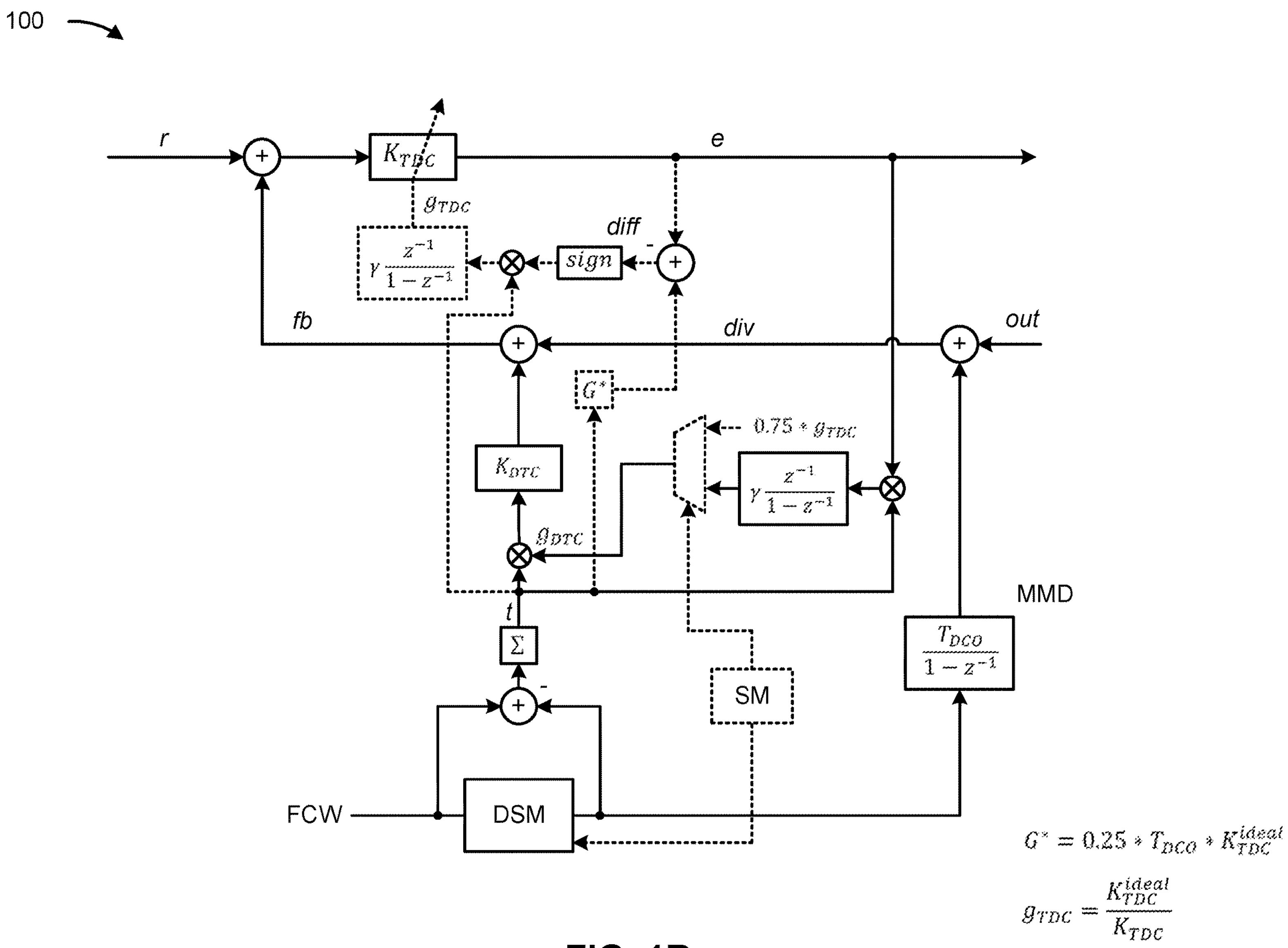

FIGS. 1A and 1B are diagrams associated with an example implementation of a DPLL 100 capable of performing TDC calibration as described herein. As shown in FIG. 1A, the DPLL 100 may include a reference oscillator (REF) 102, a TDC 104, a DLF 106, a DCO 108, a frequency divider (DIV) 110, a DSM 112, a TDC calibration component 114, and a DTC 116.

The REF 102 is a component configured to provide a reference signal. That is, the REF 102 is component that provides a reference signal based on which an output signal (identified as out in FIG. 1A) of the DPLL 100 is to be generated and with which the output signal is to be synchronized. The reference signal is identified as r in FIG. 1A.

The TDC 104 is a component configured to provide a phase error signal that indicates a phase difference between the reference signal and a feedback signal. That is, the TDC 104 may detect a phase difference between the reference signal and the feedback signal generated by the DPLL 100. The phase error signal and the feedback signal are identified as e and fb, respectively, in FIG. 1A. As shown, in some implementations, the feedback signal is an output of the DTC 116. Thus, in some implementations, the feedback signal is a version of a frequency-divided output signal (output by the DIV 110) from which a quantization error of the DSM 112 has been at least partially removed by the DTC 116. Alternatively, the feedback signal is in some implementations an output of the DIV 110 (e.g., when the DPLL 100 does not include the DTC 116, an example of which is described below with respect to FIGS. 2A and 2B). Thus, in some implementations, the feedback signal is the frequency-divided output signal output by the DIV 110. The frequency-divided output signal is identified as div in FIG. 1A. In some implementations, a gain of the TDC 104 is controlled by the TDC calibration component 114, as described herein.

The DLF 106 is a component configured to control the DCO 108 based on the phase error signal provided by the TDC 104. That is, the DLF 106 may be configured to receive the phase error signal and adjust control of the DCO 108 based on the phase error signal (e.g., in order to improve synchronization between the reference signal and the output signal of the DPLL 100).

The DCO 108 is a component configured to generate the output signal of the DPLL 100. In some implementations, a frequency or other characteristic of the output signal generated by the DCO 108 is controlled by the DLF 106, as described above. In some implementations, as shown in FIG. 1A, the DCO 108 may be configured to provide the output signal to the DIV 110 (in addition to providing the output signal as an output of the DPLL 100).

The DIV 110 is a component configured to perform frequency division on the output signal of the DPLL 100 to generate the frequency-divided output signal. In some implementations, the frequency-divided output signal is a signal that has a frequency that matches the frequency of the reference signal and a phase that matches the phase of the output signal. In some implementations, the DIV 110 may include a multi-modulus divider (MMD). In some implementations, the DIV 110 is driven by the DSM 112 and, therefore, performs the frequency division based on an output of the DSM 112. In some implementations, the frequency-divided output signal output by the DIV 110 is provided as an input to the DTC 116, as shown in FIG. 1A. Alternatively, the frequency-divided output signal output by the DIV 110 is in some implementations provided as an input to the TDC 104 (e.g., when the DPLL 100 does not include the DTC 116, an example of which is described below with respect to FIGS. 2A and 2B). As noted above, in an implementation in which the frequency-divided output signal is provided as an input to the TDC 104, the frequency-divided output signal may correspond to the feedback signal.

The DSM 112 is a component configured to drive the DIV 110 and to provide a test signal that represents a quantization error of the DSM 112. The test signal is identified as tin FIG. 1A. In some implementations, the test signal output by the DSM 112 is provided as an input to the TDC calibration component 114. In some implementations, the test signal can be used by the TDC calibration component 114 in association with performing calibration of the TDC 104, as described herein. Additionally, in some implementations, the test signal output by the DSM 112 is used by the DTC 116 to at least partially remove the quantization error of the DSM 112 from the frequency-divided output signal (e.g., such that at least a portion of the quantization error is not present in the feedback signal provided to the TDC 104).

The TDC calibration component 114 is a component configured to calibrate the TDC 104. In some implementations, the TDC calibration component 114 is configured to calibrate the TDC 104 while the DPLL 100 is operating in a phase-locked state. That is, the TDC calibration component 114 may perform calibration of the TDC 104 after the DPLL 100 has reached and is operating in a phase-locked state. In some implementations, the TDC calibration component 114 calibrates the TDC 104 by applying a gain adjustment factor to the TDC 104 (e.g., during operation of the DPLL 100 in a TDC calibration mode). In some implementations, the gain adjustment factor applied by the TDC calibration component 114 is based on the test signal representing the quantization error of the DSM 112 and the phase error signal. In some implementations, as described herein, the phase error signal utilized by the TDC calibration component 114 may include a predetermined percentage of the quantization error of the DSM 112. Additional details regarding operation of the TDC calibration component 114 are provided in the example operation of the DPLL 100 described below.

The DTC 116 is a component configured to at least partially remove the quantization error of the DSM 112 from the frequency-divided output signal. For example, the DTC 116 may be configured to remove the quantization error from the frequency-divided output signal during operation of the DPLL 100 in a normal operation mode. As another example, the DTC 116 may be configured to partially remove the quantization error from the frequency-divided output signal during operation of the DPLL 100 in a TDC calibration mode. In some implementations, the DTC 116 performs the at least partial removal of the quantization error based on the test signal representing the quantization error of the DSM 112. Here, a signal resulting from the at least partial removal of the quantization error of the DSM 112 from the frequency-divided output signal is the feedback signal (i.e., the signal provided as input to the TDC 104 in association with generating the phase error signal).

In some implementations, in order to enable partial removal of the quantization error from the frequency-divided output signal by the DTC 116, the DPLL 100 includes a circuit component configured to cause the DTC 116 to provide a predetermined percentage of the quantization error of the DSM 112 such that the predetermined percentage of the quantization error is included in the feedback signal and, therefore, is included in the phase error signal. In some implementations, the predetermined percentage of the quantization error is in a range from approximately 10% of the quantization error to approximately 35% of the quantization error, such as 25% of the quantization error. In some implementations, the predetermined percentage of the quantization error is based on a linear range of the TDC 104 in which gain of the TDC 104 is to be controlled. That is, the predetermined percentage of the quantization error can be selected based on a linear range of the TDC 104 in which bandwidth control is desired. In some implementations, the circuit component may cease causing the predetermined percentage of the quantization error to be included in the phase error signal during operation of the DPLL 100 in the normal operation mode. That is, the circuit component may permit the DTC 116 to remove the entirety of the quantization error from the frequency-divided output signal during operation in the normal operation mode. Additional details regarding operation of the DTC 116 and the circuit component are provided in the example operation of the DPLL 100 described below.

In an example operation of the DPLL 100 shown in FIG. 1A, the REF 102 provides a reference signal to the TDC 104. The TDC 104 receives the reference signal from the REF 102, receives a feedback signal from the DTC 116, and the TDC 104 provides a phase error signal based on the reference signal and the feedback signal. Here, the phase error signal indicates a phase difference between the reference signal and the feedback signal. The DLF 106 receives the phase error signal and controls the DCO 108 based on the phase error signal (e.g., so as improve synchronization between the reference signal and the output signal). The DCO 108 generates the output signal of the DPLL 100, with a frequency or other characteristic of the output signal being controlled by the DLF 106. The output signal is also provided to the DIV 110. The DIV 110 receives the output signal and performs frequency division on the output signal based on an output of the DSM 112 to generate a frequency-divided output signal feedback signal. The frequency-divided output signal is provided to the DTC 116. As further shown, the DSM 112 provides a test signal representing the quantization error of the DSM 112.

During operation in a normal mode, the DTC 116 removes the quantization error of the DSM 112 from the frequency-divided output signal (e.g., such that the feedback signal does not include the quantization error of the DSM 112). In some implementations, the quantization error can be removed through control of a gain of the DTC 116. The gain of the DTC 116 can be controlled by the applying a gain adjustment factor $g_{DTC}$ to the DTC 116. The gain adjustment factor $g_{DTC}$ can be selected so as to remove the quantization error of the DSM 112 from the frequency-divided output signal when generating the feedback signal. In some implementations, the DPLL 100 may be configured with a least mean squares (LMS) algorithm to determine the gain adjustment factor $g_{DTC}$. Here, the quantization error of the DSM 112 is cancelled out once convergence of the LMS algorithm is reached.

In some implementations, the DPLL 100 may operate in a TDC calibration mode. For example, the DPLL 100 may, upon achieving a phase-locked state and convergence of the gain of the DTC 116 as described above, begin operation in the TDC calibration mode. In some implementations, a circuit component of the DPLL 100 associated with controlling the calibration procedure may cause the DPLL 100 to begin operation in the TDC calibration mode. In some implementations, during operation in the TDC calibration mode, the circuit component causes the DTC 116 to only partially remove the quantization error of the DSM from the frequency-divided output signal. That is, during operation in the TDC calibration mode, the circuit component may cause the DTC 116 to provide a predetermined percentage of the quantization error such that the predetermined percentage of the quantization error is included in the feedback signal and, therefore, is included in the phase error signal received at the TDC calibration component 114. In some implementations, the quantization error being included in the phase error signal enables the TDC calibration component 114 to perform calibration of the TDC 104, as described in further detail below.

In some implementations, during operation in the TDC calibration mode, the TDC calibration component 114 may calibrate the TDC 104 by applying a gain adjustment factor $g_{DTC}$ to the TDC 104. In some implementations, the TDC calibration component 114 may compute the gain adjustment factor $g_{TDC}$ based on the test signal provided by the DSM 112 and the phase error signal (including the predetermined percentage of the quantization error) provided by the TDC 104.

For example, the TDC calibration component 114 may apply a gain to the test signal to generate a gain adjusted test signal. Here, the gain applied to the test signal may be based on a period of the DCO 108, an ideal gain of the TDC 104, and the predetermined percentage of the quantization error included in the phase error signal. For example, if the predetermined percentage of the quantization error included in the phase error signal is 25%, then the gain applied to the test signal can be computed using the formula:

$$G^*=0.25*T_{DCO}*K_{TDC}^{ideal}$$

where G* represents the gain applied to the test signal, 0.25 corresponds the predetermined percentage of the quantization error, $T_{DCO}$ represents the period of the DCO 108, and $K_{TDC}^{ideal}$ represents the ideal gain of the TDC 104. The TDC calibration component 114 may then generate a difference signal by determining a difference between the phase error signal and the gain adjusted test signal. The TDC calibration component 114 may then compute the gain adjustment factor based on the difference signal.

In some implementations, the TDC calibration component 114 may compute the gain adjustment factor using an LMS algorithm. Here, the LMS algorithm serves to reduce or minimize (e.g., null) the difference signal in order to match the gain along the path of the DIV 110 and the TDC 104 with the gain G* applied to the test signal. The condition that causes the difference signal to be reduced or minimized is the gain adjustment factor $g_{TDC}$ being equal to the ideal gain of the TDC 104 divided by the actual gain of the TDC 104 (e.g., $g_{TDC}=K_{TDC}^{ideal}/K_{TDC}$, where $K_{TDC}$ represents the actual gain of the TDC 104). Thus, in some implementations, the gain adjustment factor $g_{TDC}$ corresponds to a result of dividing the ideal gain of the TDC 104 by the actual gain of the TDC 104. In this way, the TDC calibration component 114 may use the gain adjustment factor $g_{TDC}$ to reduce or minimize a difference between the phase error signal including the predetermined percentage of the quantization error and the gain adjusted test signal in order to provide calibration of the TDC 104. Notably, the predetermined percentage of the quantization error is utilized as a training sequence for the LMS algorithm associated with computing the gain adjustment factor $g_{TDC}$.

In some aspects, calibration of the TDC 104 (e.g., after the LMS algorithm reduces or minimizes the difference signal), the circuit component may cease causing the predetermined percentage of the quantization error to be included in the phase error signal. That is, after calibration of the TDC 104, the circuit component may cause the DPLL 100 to resume operation in the normal mode such that the DTC 116 fully removes the quantization error from the frequency-divided output signal when generating the feedback signal. Here, the TDC calibration component 114 may freeze the gain adjustment factor $g_{TDC}$ during operation of the DPLL 100 in a normal operation mode. That is, when the DPLL 100 enters the normal operation mode after calibration of the TDC 104, the TDC calibration component 114 may keep the gain adjustment factor unchanged during operation of the DPLL 100 in the normal operation mode.

In some implementations, the DPLL 100 may re-enter operation in the TDC calibration mode at a later time. For example, the circuit component may determine that a temperature condition associated with the DPLL is satisfied and may cause the DPLL 100 to re-enter TDC calibration mode (e.g., such that the TDC 104 is recalibrated). As one example, the temperature condition may be a determination that a temperature at or near the DPLL 100 has reached a temperature threshold (e.g., an absolute temperature threshold). As another example, the temperature condition may be a determination that a temperature at or near the DPLL 100 has changed by a threshold amount from a temperature at which a previous TDC calibration was performed (e.g., a delta temperature threshold).

FIG. 1B is a diagram illustrating an example of a detailed representation of TDC calibration as provided by the DPLL 100 shown in FIG. 1A. As a preliminary step, the DPLL 100 should achieve a phase-locked state and convergence of the gain of the DTC 116, as described above. Once these conditions are satisfied, a state machine (SM) (e.g., included in the circuit component of the DPLL 100) may cause the DPLL 100 to begin operation in the TDC calibration mode. While operating in the TDC calibration mode, the circuit component causes a predetermined percentage of the quantization error of the DSM 112 (e.g., 25% is used in the example shown in FIG. 1B) to reach the TDC 104 (such that the predetermined percentage of the quantization error is included in the phase error signal provided by the TDC 104). In some implementations, as illustrated in FIG. 1B, the predetermined percentage of the quantization error is permitted to reach the TDC 104 by forcing a complementary percentage (e.g., 75%) of the gain of the DTC 116 that was previously computed in association with fully cancelling the quantization error of the DSM 112. Here, forcing the complementary percentage of the DTC 116 gain allows the predetermined percentage of the quantization error to go through the DTC 116 (i.e., not be canceled). As described above, the predetermined percentage of the quantization error that reaches the TDC 104 serves as a training signal that can be used by an LMS algorithm to estimate correlation with the quantization error of the DSM 112 and, therefore the gain of the TDC 104, to achieve the ideal gain of the TDC 104.

As indicated above, FIGS. 1A and 1B are provided as an example. Other examples may differ from what is described with regard to FIGS. 1A and 1B. The number and arrangement of components shown in FIGS. 1A and 1B are provided as an example. In practice, there may be additional components, fewer components, different components, or differently arranged components than those shown in FIGS. 1A and 1B. Furthermore, two or more components shown in FIGS. 1A and 1B may be implemented within a single component, or a single component shown in FIGS. 1A and 1B may be implemented as multiple, distributed components. Additionally, or alternatively, a set of components (e.g., one or more components) shown in FIGS. 1A and 1B may perform one or more functions described as being performed by another set of components shown in FIGS. 1A and 1B.

Figure 2A:
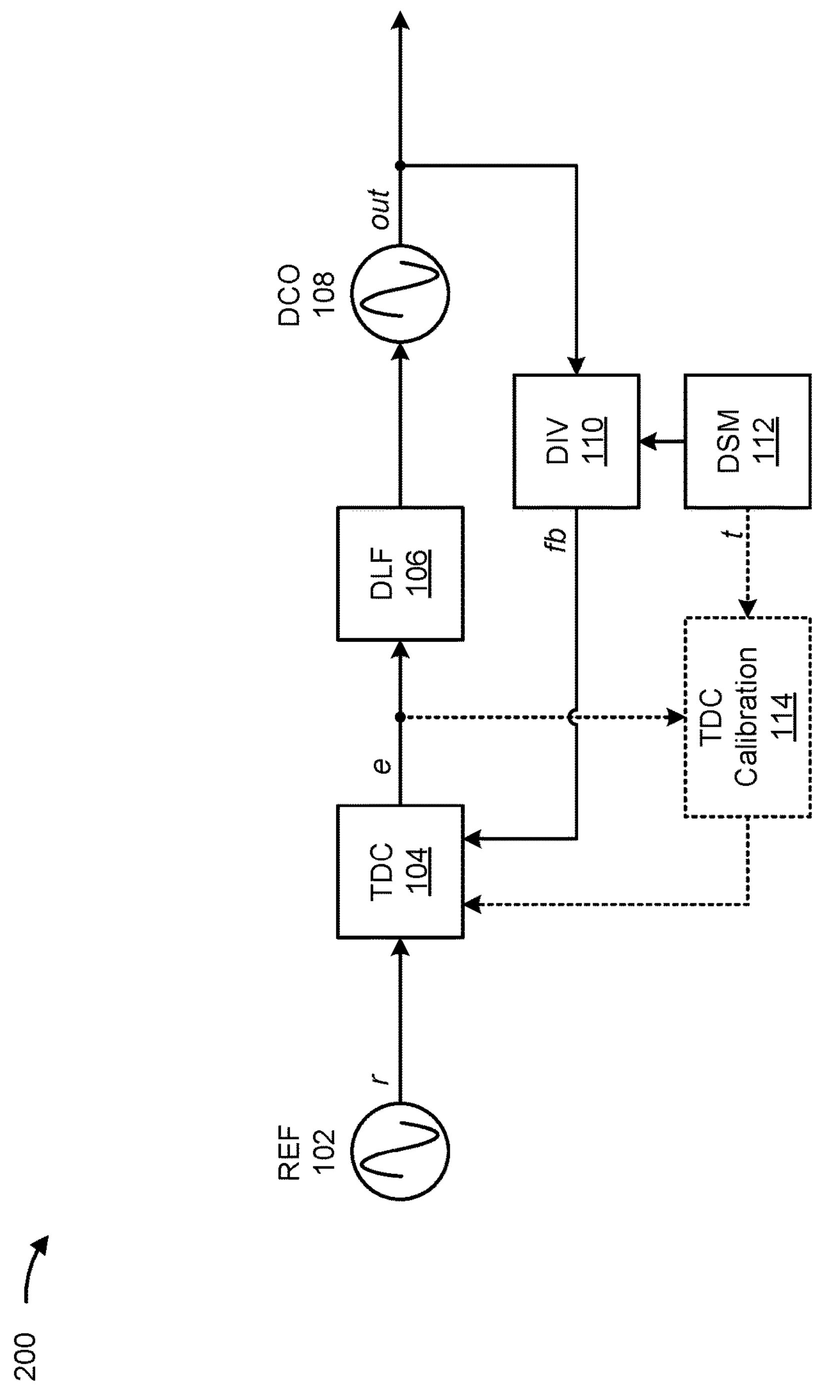
FIGS. 2A and 2B are diagrams associated with another example implementation of a DPLL capable of providing TDC calibration, as described herein.
Figure 2B:
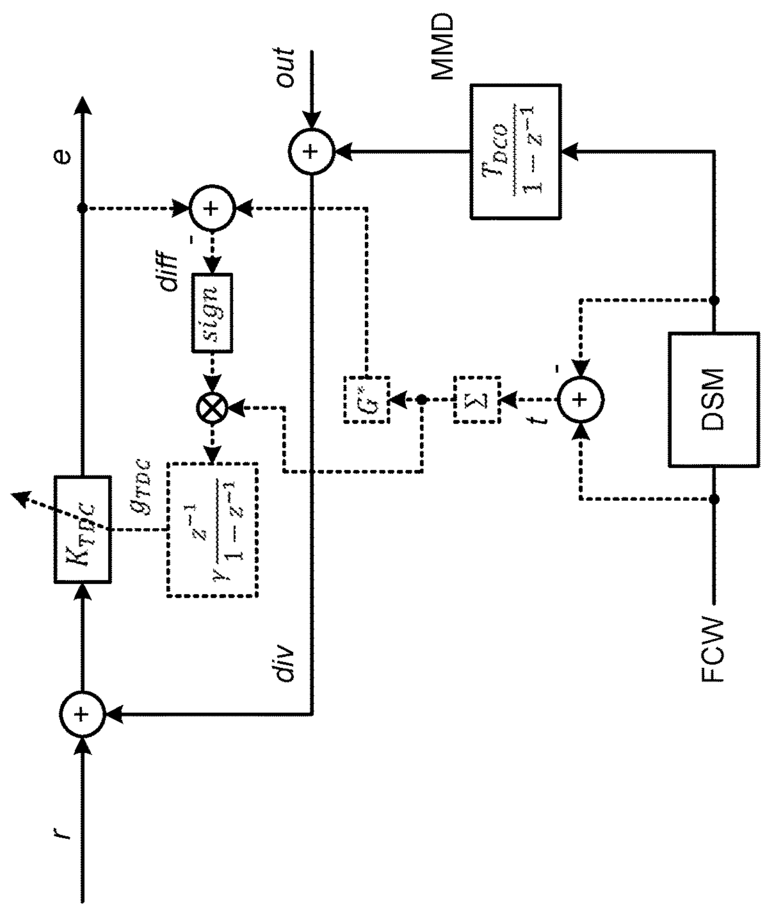

FIGS. 2A and 2B are diagrams associated with another example implementation of the DPLL 100 capable of providing TDC calibration, as described herein. In some implementations, the DPLL 100 may be a DTC-based DPLL 100, as shown and described with respect to FIGS. 1A and 1B. Alternatively, in some implementations, the DPLL 100 may not be a DTC-based DPLL. That is, the DPLL 100 may in some implementations not include the DTC 116.

For example, as shown in FIG. 2A, the DPLL 100 may include the REF 102, the TDC 104, the DLF 106, the DCO 108, the DIV 110, the DSM 112, and the TDC calibration component 114. Notably, the DPLL 100 shown in FIG. 2A does not include a DTC 116. In such an implementation, operation of the DPLL 100 is similar to that described above except that (1) the feedback signal utilized by the TDC 104 is the frequency-divided output signal generated by the DIV 110 and (2) the entirety of the quantization error is included in the feedback signal (e.g., since the quantization error is not at least partially removed from the frequency-divided output signal).

In an example operation of the DPLL 100 shown in FIG. 2A, the REF 102 provides a reference signal to the TDC 104. The TDC 104 receives the reference signal from the REF 102, receives a feedback signal from the DIV 110, and provides a phase error signal based on the reference signal and the feedback signal. Here, the phase error signal indicates a phase difference between the reference signal and the feedback signal. The DLF 106 receives the phase error signal and controls the DCO 108 based on the phase error signal (e.g., so as improve synchronization between the reference signal and the output signal). The DCO 108 generates the output signal of the DPLL 100, with a frequency or other characteristic of the output signal being controlled by the DLF 106. The output signal is also provided to the DIV 110. The DIV 110 receives the output signal and performs frequency division on the output signal based on an output of the DSM 112 to generate a frequency-divided output signal feedback signal, which corresponds to the feedback signal. As further shown, the DSM 112 provides a test signal representing the quantization error of the DSM 112.

Here, the TDC calibration component 114 may calibrate the TDC 104 while the DPLL is operating in a phase-locked state by applying the gain adjustment factor $g_{TDC}$ to the TDC 104. For example, the TDC calibration component 114 may apply a gain to the test signal to generate a gain adjusted test signal, may generate a difference signal by determining a difference between the phase error signal and the gain adjusted test signal, and may compute the gain adjustment factor $g_{TDC}$ based on the difference signal. Notably, in the DPLL 100 shown in FIG. 2A, the entirety of the quantization error is included in the phase error signal. Thus, the gain applied to the test signal can be computed using the formula:

$$G^* = T_{DCO} * K_{TDC}^{ideal}$$

In some implementations, the TDC calibration component 114 may compute the gain adjustment factor using an LMS algorithm (e.g., similar to the manner described above with respect to FIGS. 1A and 1B). Here, the LMS algorithm serves to reduce or minimize (e.g., null) the difference signal in order to match the gain along the path of the DIV 110 and the TDC 104 with the gain G* applied to the test signal. As described above, the condition that causes the difference signal to be reduced or minimized is the gain adjustment factor $g_{TDC}$ being equal to the ideal gain of the TDC 104 divided by the actual gain of the TDC 104 (e.g., $g_{TDC}=g_{TDC}^{ideal}/K_{TDC}$). Thus, in some implementations, the gain adjustment factor $g_{TDC}$ corresponds to a result of dividing the ideal gain of the TDC 104 by the actual gain of the TDC 104. In this way, the TDC calibration component 114 may use the gain adjustment factor $t_{h}$-$_{Dc}$ to reduce or minimize a difference between the phase error signal including the quantization error and the gain adjusted test signal in order to provide calibration of the TDC 104. Notably, the entirety of the quantization error is utilized as a training sequence for the LMS algorithm associated with computing the gain adjustment factor $g_{TDC}$ in the example implementation shown in FIG. 2A.

FIG. 2B is a diagram illustrating an example of a detailed representation of TDC calibration as provided by the DPLL 100 shown in FIG. 2A. As a preliminary step, the DPLL 100 should achieve a phase-locked state, as described above. Once this condition is satisfied, the quantization error that reaches the TDC 104 serves as a training signal that can be used by an LMS algorithm to estimate correlation with the quantization error of the DSM 112 and, therefore the gain of the TDC 104, to achieve the ideal gain of the TDC 104.

As indicated above, FIGS. 2A and 2B are provided as an example. Other examples may differ from what is described with regard to FIGS. 2A and 2B. The number and arrangement of components shown in FIGS. 2A and 2B are provided as an example. In practice, there may be additional components, fewer components, different components, or differently arranged components than those shown in FIGS. 2A and 2B. Furthermore, two or more components shown in FIGS. 2A and 2B may be implemented within a single component, or a single component shown in FIGS. 2A and 2B may be implemented as multiple, distributed components. Additionally, or alternatively, a set of components (e.g., one or more components) shown in FIGS. 2A and 2B may perform one or more functions described as being performed by another set of components shown in FIGS. 2A and 2B.

In this way, a DPLL 100 may perform TDC calibration that reliably controls TDC gain such that a bandwidth of the DPLL 100 is stable over PVT variation. Further, the techniques for TDC calibration described herein are of low complexity (e.g., the TDC calibration does not require additional analog circuitry), provide stable tracking of the PVT variations in the background of operational loop of the DPLL 100, and do not require a test signal to be added (e.g., only a reconfiguration of hardware may be needed).

Figure 3:
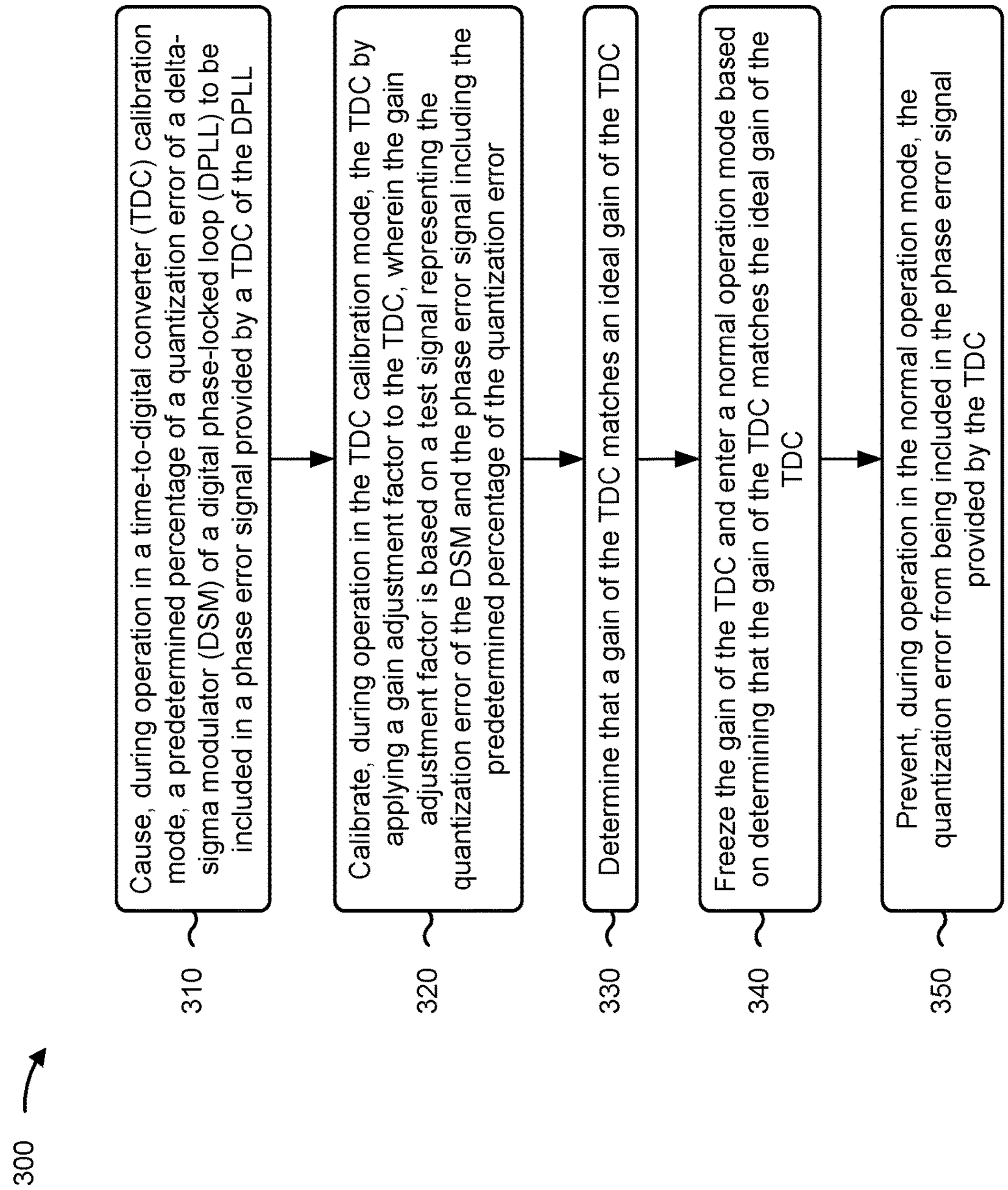
FIG. 3 is a flowchart of an example process relating to TDC calibration, as described herein.

FIG. 3 is a flowchart of an example process 300 relating to TDC calibration, as described herein. In some implementations, one or more process blocks of FIG. 3 are performed by one or more components of a DPLL (e.g., DPLL 100). For example, in some implementations, one or more process blocks of FIG. 3 are performed by one or more components of the DPLL, such as a reference oscillator (e.g., REF 102), a TDC (e.g., TDC 104), a DLF (e.g., DLF 106), a DCO (e.g., DCO 108), a DIV (e.g., DIV 110), a DSM (e.g., DSM 112), a TDC calibration component (e.g., TDC calibration component 114), and/or a DTC (e.g., DTC 116).

As shown in FIG. 3, process 300 may include causing, during operation in a TDC calibration mode, a predetermined percentage of a quantization error of the DSM of a DPLL to be included in a phase error signal provided by the TDC of the DPLL (block 310). For example, the DPLL (e.g., a circuit component of the TDC calibration component) may cause, during operation in a TDC calibration mode, a predetermined percentage of a quantization error of the DSM to be included in a phase error signal provided by the TDC, as described above.

As further shown in FIG. 3, process 300 may include calibrating, during operation in the TDC calibration mode, the TDC by applying a gain adjustment factor to the TDC, where the gain adjustment factor is based on a test signal representing the quantization error of the DSM and the phase error signal including the predetermined percentage of the quantization error (block 320). For example, the DPLL (e.g., the TDC calibration component) may calibrate, during operation in the TDC calibration mode, the TDC by applying a gain adjustment factor to the TDC, where the gain adjustment factor is based on a test signal representing the quantization error of the DSM and the phase error signal including the predetermined percentage of the quantization error, as described above.

As further shown in FIG. 3, process 300 may include determining that a gain of the TDC matches an ideal gain of the TDC (block 330). For example, the DPLL (e.g., the TDC calibration component) may determine that a gain of the TDC matches an ideal gain of the TDC, as described above.

As further shown in FIG. 3, process 300 may include freezing the gain of the TDC and entering a normal operation mode based on determining that the gain of the TDC matches the ideal gain of the TDC (block 340). For example, the DPLL (e.g., the TDC calibration component) may freeze the gain of the TDC and entering a normal operation mode based on determining that the gain of the TDC matches the ideal gain of the TDC, as described above.

As further shown in FIG. 3, process 300 may include preventing, during operation in the normal operation mode, the quantization error from being included in the phase error signal provided by the TDC (block 350). For example, the DPLL (e.g., the circuit component of the TDC calibration component) may prevent, during operation in the normal operation mode, the quantization error from being included in the phase error signal provided by the TDC, as described above.

Process 300 may include additional implementations, such as any single implementation or any combination of implementations described below and/or in connection with one or more other processes described elsewhere herein.

In a first implementation, causing the predetermined percentage of the quantization error to be included in the phase error signal comprises forcing a particular percentage of a gain of the DTC.

In a second implementation, alone or in combination with the first implementation, preventing the quantization error from being included in the phase error signal comprises restoring 100% of a gain of the DTC.

In a third implementation, alone or in combination with one or more of the first and second implementations, process 300 includes determining that the DPLL has reached a phase-locked state, and entering the TDC calibration mode based on determining that the DPLL has reached the phase-locked state.

In a fourth implementation, alone or in combination with one or more of the first through third implementations, process 300 includes entering operation in the TDC calibration mode based on determining that a temperature condition associated with the DPLL is satisfied.

In a fifth implementation, alone or in combination with one or more of the first through fourth implementations, the predetermined percentage of the quantization error is in a range from approximately 10% of the quantization error to approximately 35% of the quantization error.

In a sixth implementation, alone or in combination with one or more of the first through fifth implementations, wherein the predetermined percentage of the quantization error is based on a linear range of the TDC in which gain of the TDC is to be controlled.

In a seventh implementation, alone or in combination with one or more of the first through sixth implementations, process 300 includes applying a gain to the test signal to generate a gain adjusted test signal, where the gain applied to the test signal is based on a period of the DCO, an ideal gain of the TDC, and the predetermined percentage of the quantization error included in the phase error signal; generating a difference signal by determining a difference between the phase error signal and the gain adjusted test signal; and computing the gain adjustment factor based on the difference signal.

In an eighth implementation, alone or in combination with one or more of the first through seventh implementations, the TDC calibration component is configured to compute the gain adjustment factor using an LMS algorithm.

In a ninth implementation, alone or in combination with one or more of the first through eighth implementations, applying a gain adjustment factor to the TDC to calibrate the TDC causes a difference between the phase error signal and a gain adjusted test signal to be reduced.

In a tenth implementation, alone or in combination with one or more of the first through ninth implementations, a gain adjustment factor corresponds to a result of dividing an ideal gain of the TDC by an actual gain of the TDC.

Although FIG. 3 shows example blocks of process 300, in some implementations, process 300 includes additional blocks, fewer blocks, different blocks, or differently arranged blocks than those depicted in FIG. 3. Additionally, or alternatively, two or more of the blocks of process 300 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software. It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items,), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A digital phase-locked loop (DPLL), comprising:

a time-to-digital converter (TDC) configured to provide a phase error signal that indicates a phase difference between a reference signal and a feedback signal;

a frequency divider configured to perform frequency division on an output signal of the DPLL to generate a frequency-divided output signal, and a delta-sigma modulator (DSM) configured to provide a test signal that represents a quantization error of the DSM;

a digital-to-time converter (DTC) configured to at least partially remove the quantization error of the DSM from the frequency-divided output signal based on the test signal to generate the feedback signal;

a circuit component to, during operation in a TDC calibration mode, cause the DTC to provide a predetermined percentage of the quantization error such that the predetermined percentage of the quantization error is included in the phase error signal; and a TDC calibration component configured to, during operation in the TDC calibration mode, calibrate the TDC by applying a gain adjustment factor to the TDC, wherein the gain adjustment factor is based on the test signal and the phase error signal including the predetermined percentage of the quantization error.

2. The DPLL of claim 1, wherein the circuit component is configured to cease causing the predetermined percentage of the quantization error to be included in the phase error signal during operation in a normal operation mode.

3. The DPLL of claim 1, wherein the predetermined percentage of the quantization error is in a range from approximately 10% of the quantization error to approximately 35% of the quantization error.

4. The DPLL of claim 1, wherein the predetermined percentage of the quantization error is based on a linear range of the TDC in which gain of the TDC is to be controlled.

5. The DPLL of claim 1, wherein the TDC calibration component is further configured to:

apply a gain to the test signal to generate a gain adjusted test signal, wherein the gain applied to the test signal is based on a period of a digitally-controlled oscillator (DCO), an ideal gain of the TDC, and the predetermined percentage of the quantization error included in the phase error signal;

generate a difference signal by determining a difference between the phase error signal and the gain adjusted test signal; and compute the gain adjustment factor based on the difference signal.

6. The DPLL of claim 1, wherein the TDC calibration component is configured to compute the gain adjustment factor using a least mean squares (LMS) algorithm.

7. The DPLL of claim 1, wherein the TDC calibration component, when applying the gain adjustment factor to the TDC to calibrate the TDC, causes a difference between the phase error signal and a gain adjusted test signal to be reduced.

8. The DPLL of claim 1, wherein the gain adjustment factor corresponds to a result of dividing an ideal gain of the TDC by an actual gain of the TDC.

9. The DPLL of claim 1, wherein the TDC calibration component is configured to freeze the gain adjustment factor during operation in a normal operation mode.

10. The DPLL of claim 1, wherein the TDC calibration component is configured to calibrate the TDC while the DPLL is operating in a phase-locked state.

11. A digital phase-locked loop (DPLL), comprising:

a time-to-digital converter (TDC) configured to provide a phase error signal that indicates a phase difference between a reference signal and a feedback signal;

a frequency divider configured to perform frequency division on an output signal of the DPLL to generate the feedback signal;

a delta-sigma modulator (DSM) configured to provide a test signal associated with calibrating the TDC, wherein the test signal represents a quantization error of the DSM; and a TDC calibration component configured to calibrate the TDC while the DPLL is operating in a phase-locked state by applying a gain adjustment factor to the TDC, wherein the gain adjustment factor is based on the phase error signal and the test signal.

12. The DPLL of claim 11, wherein the TDC calibration component is further configured to:

apply a gain to the test signal to generate a gain adjusted test signal, wherein the gain applied to the test signal is based on a period of a digitally-controlled oscillator (DCO) and an ideal gain of the TDC;

generate a difference signal by determining a difference between the phase error signal and the gain adjusted test signal; and compute the gain adjustment factor based on the difference signal.

13. The DPLL of claim 11, wherein the TDC calibration component is configured to compute the gain adjustment factor using a least mean squares (LMS) algorithm.

14. The DPLL of claim 11, wherein the TDC calibration component, when applying the gain adjustment factor to the TDC to calibrate the TDC, causes a difference between the phase error signal and a gain adjusted test signal to be reduced.

15. The DPLL of claim 11, wherein the gain adjustment factor corresponds to a result of dividing an ideal gain of the TDC by an actual gain of the TDC.

16. A method, comprising;

causing, during operation in a time-to-digital converter (TDC) calibration mode, a predetermined percentage of a quantization error of a delta-sigma modulator (DSM) of a digital phase-locked loop (DPLL) to be included in a phase error signal provided by a TDC of the DPLL;

calibrating, during operation in the TDC calibration mode, the TDC by applying a gain adjustment factor to the TDC, wherein the gain adjustment factor is based on a test signal representing the quantization error of the DSM and the phase error signal including the predetermined percentage of the quantization error;

determining that a gain of the TDC matches an ideal gain of the TDC;

freezing the gain of the TDC and entering a normal operation mode based on determining that the gain of the TDC matches the ideal gain of the TDC; and preventing, during operation in the normal operation mode, the quantization error from being included in the phase error signal provided by the TDC.

17. The method of claim 16, wherein causing the predetermined percentage of the quantization error to be included in the phase error signal comprises forcing a particular percentage of a gain of a digital-to-time converter (DTC).

18. The method of claim 16, wherein preventing the quantization error from being included in the phase error signal comprises restoring 100% of a gain of a digital-to-time converter (DTC).

19. The method of claim 16, further comprising:

determining that the DPLL has reached a phase-locked state, and entering the TDC calibration mode based on determining that the DPLL has reached the phase-locked state.

20. The method of claim 16, further comprising re-entering operation in the TDC calibration mode based on determining that a temperature condition associated with the DPLL is satisfied.

* * * * *